United States Patent [19]

Alkire et al.

[11] 4,043,891
[45] Aug. 23, 1977

[54] ELECTROLYTIC CELL WITH BIPOLAR ELECTRODES

[75] Inventors: Richard Collin Alkire, Champaign, Ill.; Werner Engelmaier, Mendham, N.J.; Thomas Jacob Kessler, East Rochester, N.Y.

[73] Assignee: Bell Telephone Laboratories, Incorporated, Murray Hill, N.J.

[21] Appl. No.: 649,041

[22] Filed: Jan. 14, 1976

[51] Int. Cl.$^2$ .................. C25D 3/38; C25D 17/10; C25D 17/12
[52] U.S. Cl. ................. 204/231; 204/52 R; 204/222; 204/268
[58] Field of Search ............. 204/268, DIG. 7, 222, 204/228, 231, 242, 267

[56] References Cited

U.S. PATENT DOCUMENTS

| 565,953 | 8/1896 | Andreoli | 204/251 |
| 568,724 | 10/1896 | Andreoli | 204/268 X |
| 883,170 | 3/1908 | Christy | 204/268 |
| 3,214,362 | 10/1965 | Juda | 204/255 |
| 3,511,758 | 5/1970 | Bedi | 204/231 X |
| 3,637,468 | 1/1972 | Icxi et al. | 204/15 |
| 3,801,488 | 4/1974 | Okuhara et al. | 204/252 |
| 3,856,652 | 12/1974 | Fleischmann et al. | 204/268 |

FOREIGN PATENT DOCUMENTS 493,113  1935  United Kingdom ................. 204/231

Primary Examiner—F.C. Edmundson
Attorney, Agent, or Firm—J. S. Cubert

[57] ABSTRACT

In the electrodeposition of metals, the position and shape of the anode with respect to the cathode is critical for uniform deposition of the metal on the cathode. A bipolar electrode comprising a pair of electrically interconnected porous electrodes having surfaces of the metal to be deposited is interposed between the anode and the cathode. The bipolar porous electrode facing the cathode provides metal ions for deposition on the cathode and the bipolar porous electrode facing the anode is plated with metal ions formed at the anode. The position of the bipolar electrode may be periodically reversed, and uniform deposition on the cathode is obtained independent of the shape, size, and position of the anode.

7 Claims, 5 Drawing Figures

ELECTROLYTIC CELL WITH BIPOLAR ELECTRODES

BACKGROUND OF THE INVENTION

Our invention relates to electrodeposition techniques and, more particularly, to the deposition of a selected metal on the cathode of an electroplating cell.

In electroplating, it is often desirable to obtain a uniform thickness of deposited metal on the cathode of the electroplating cell. This uniformity is a function of both composition, operating conditions, potential field, and current distribution over the cell electrodes. Control of the electrolytic solution and the electrode and cell geometry provide a degree of uniformity in cathodic current distribution. It is often necessary, however, to use auxiliary aids to modify the potential field in the cell and to agitate the electrolytic solution to obtain satisfactory results. The restrictions of cell geometry and variations in operating conditions, however, limit the degree of cathodic current uniformity and the resulting uniformity of the metal deposited on the cathode.

Where the surface of the cathode is large, uniformity of cathodic current distribution is difficult to control and the cell operation must be carefully monitored. The preparation of printed circuit boards, for example, requires the uniform deposition of copper over a relatively large surface area. Nonuniformity in the copper deposition results in deleterious electrical and mechanical properties of the printed wiring pattern. To obtain the needed uniformity the placement and geometry of the copper anodes of the cell with respect to the cathode surface to be plated are critical. Additionally, the cell configuration must allow for sufficient agitation of the electrolytic solution. It is an object of the invention to provide uniform deposition of metal on a cell cathode in an economical manner without critical placement of a plurality of cell electrodes or auxiliary devices.

SUMMARY OF THE INVENTION

Our invention is directed to electrodeposition of a selected metal on the cathode of an electroplating cell containing an electrolytic solution wherein the anode and cathode of the cell are in spaced relation, and first and second electrically connected porous electrodes each comprising a surface of the selected metal are interposed between the anode and the cathode. The porous electrode nearer the cathode is initially plated with the metal to be deposited, whereby the deposition of the metal on the cathode is relatively uniform substantially independent of the shape and position of the anode of the cell.

According to one aspect of the invention, each porous electrode comprises a metal screen plated with the metal to be deposited. The first electrode screen is positioned in spaced relation with the cathode and the second electrode screen is positioned between the anode and the first electrode.

According to another aspect of the invention, the positions of the first and second electrodes are periodically reversed so that each of said first and second electrodes is alternately placed opposite the cell cathode. When the electrode is placed opposite the cathode, it is deplated and metallic ions are electrochemically formed for deposition on the cathode. When the electrode is placed opposite the anode, the metallic ions formed at the anode are deposited on the electrode. The periodic reversal of the first and second electrodes provides a controlled deposition substantially independent of the size, shape, and position of the anode.

According to yet another aspect of the invention the first and second electrodes are joined at their ends to form a continuous belt, which belt is moved to provide controlled deposition independent of the size, shape, and position of the anode.

According to yet another aspect of the invention, the first and second electrodes are in spaced relation to permit the introduction of an agitating gas into the electrolytic solution without restriction.

According to yet another aspect of the invention, the one of the first and second electrodes opposite the cathode is in spaced, parallel relation to said cathode and in close proximity thereto.

According to yet another aspect of the invention, the selected metal is from the group consisting of copper, nickel, gold, silver, and solder.

In one embodiment of the invention, the cell comprises a copper anode, a cathode initially coated with electroless copper, a container adapted to hold an aqueous solution of $CuSO_4$ and $H_2SO_4$ and a first porous copper electrode in spaced, parallel relation to said cathode in close proximity thereto. A second porous copper electrode is placed intermediate said first electrode and said anode, and said first and second electrodes are electrically interconnected.

DETAILED DESCRIPTION

Figure 1:
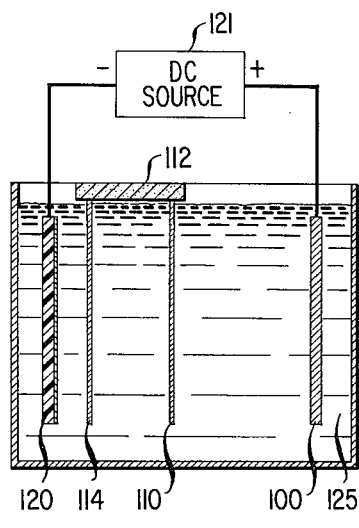
FIG. 1 depicts an electroplating cell illustrative of the invention.

FIG. 1 shows a simplified electroplating cell in which a selected metal, such as copper, nickel, silver, solder, or gold, is plated on a prepared surface of cathode 120. Anode 100, comprising the selected metal, is positioned at one end of the cell and connected to the positive terminal of d.c. source 121. Cathode 120 is positioned at the opposite end of the cell and is connected to the negative terminal of source 121. Under conditions of relatively high current applied to the cell from source 121, the ohmic resistance of the electrolytic solution in the cell substantially determines the current distribution. The potential field resulting from the ohmic resistance of the electrolytic solution is generally nonuniform so that, in the absence of auxiliary aids, current distribution across the surface of cathode 120 and the deposition of the selected metal ions on the cathode are relatively nonuniform.

Porous-type electrodes 110 and 114 are interposed between anode 100 and cathode 120. Porous electrodes 110 and 114, having surfaces of the metal to be deposited, are conductive and are electrically interconnected by bus 112 which is outside electrolytic solution 125. Electrodes 110 and 114 and bus 112 form a bipolar electrode in which porous electrode or screen 110 opposite anode 100 acts as a cathodic surface and porous electrode or screen 114 opposite cathode 120 acts as an anodic surface. Screen 110 reacts electrochemically with metallic ions formed in the vicinity of anode 100 so that these metallic ions are deposited on screen 110. Screen 114 reacts electrochemically with the electrolytic solution, whereby metallic ions are formed thereat. Bus 112 conducts current between screens 110 and 114 to sustain the electrochemical reactions. The function of the bipolar electrode comprising screens 110 and 114 and bus 112 is to remove current from the anolyte region of the cell and redistribute said current in the catholyte region.

In the cell of FIG. 1, electrode 114 is in spaced, parallel relation with cathode 120 and in close proximity thereto, so that the primary current distribution at the cathode is highly uniform and substantially independent of the size, shape, and position of cell anode 100. In the absence of the bipolar screen arrangement, the current distribution at cathode 120 would be dependent on the size, shape and position of the anode. The position of bipolar screen 110 is not critical, as long as it is adapted to receive substantially all the metal ions formed in the anolyte region. Since the current distribution at the cathode is primarily a function of the position and geometry of screen electrode 114, anode 100 may be of any convenient shape or may comprise metal scraps held in position in a suitable electrically conductive basket.

The bipolar screen arrangement of FIG. 1 is operative to provide uniform electrodeposition as long as anodic screen 114 has a surface of the metal to be plated on cathode 120. When a portion of the screen surface is depleted of the metal to be plated, the screen must be replaced to provide uniform current distribution in the catholyte region. Alternatively, the position of the screen assembly may be periodically reversed by rotation apparatus or other means so that the depleted screen is repositioned opposite the anode and the screen originally opposite the anode, which has been plated by metal ions formed in the anolyte region, is moved into position opposite the cathode. In FIG. 1 the change in position results in screen 110 being placed opposite cathode 120 and screen 114 being placed opposite anode 100. The repositioning of the bipolar electrode screens provides continuous uniform electroplating without the need to replace the depleting screen with a separately prepared screen. Advantageously, the use of the bipolar screen arrangement according to the invention permits flexibility in cell arrangement, including flexibility of placement of apparatus for agitating the electrolytic solution and apparatus for movement of the cathode.

Figure 2:
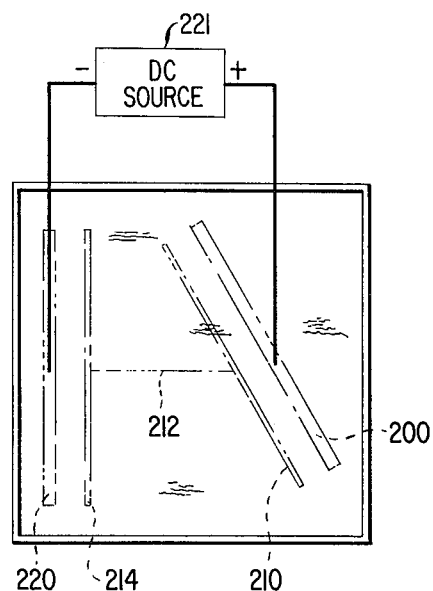
FIG. 2 shows a top view of an electroplating cell illustrative of the invention wherein the cell anode is skewed with respect to the cell cathode.

In the electroplating cell arrangement of FIG. 2 for the deposition of copper on the cathode workpiece 220, copper anode 200 is placed in skewed relationship with respect to cathode 220. The bipolar electrode comprises a pair of screens which may be copper screens or copper-plated platinized titanium expanded mesh or other suitable copper-plated porous electrodes. The electrolytic solution may comprise soluble copper ions, acid and water, e.g., copper sulfate in sulfuric acid and distilled water, with an approximate concentration of 0.3 M $CuSO_4$ and 1.5 M $H_2SO_4$.

As in FIG. 1, bus 212 electrically interconnects screens 210 and 214. Screen 214 is positioned in spaced, parallel relation to cathode workpiece 220 at a predetermined distance therefrom and screen 210 is in spaced, parallel relation with anode 200 at a convenient distance therefrom. Although screen 210 and anode 200 are shown in skewed relationship with respect to screen 214 and cathode 220, screen 210 may be positioned parallel to screen 214 without substantially affecting the uniformity of current distribution in the catholyte region.

Anode 200 is connected to the positive terminal of d.c. source 221, while cathode workpiece 200 is connected to the negative terminal of d.c. source 221. In accordance with the plating method of the invention, the bipolar electrode arrangement, including screens 210 and 214 and interconnecting bus 212, may be periodically repositioned so that each screen alternates being opposite cathode workpiece 220. This assures that the bipolar electrode screen facing cathode workpiece 220 includes a copper surface coextensive with the cathode workpiece from which copper ions are placed in the electrolytic solution in the catholyte region.

With d.c. source 221 turned on, copper ions are formed in the anolyte region and are transferred to the vicinity of screen 210 where said ions are electrochemically deposited on said screen. At screen 214, the copper surface electrochemically reacts with the electrolytic solution to provide copper ions for deposition on cathode workpiece 220. Bus 212 transfers current from the anolyte region to the catholyte region between screens 210 and 214 to support the electrochemical reactions therein.

The position of screen 214 with respect to cathode workpiece 222 is carefully controlled so that screen 214 is in spaced, substantially parallel relation to cathode 220 at a predetermined distance therefrom. This spaced, parallel relationship assures substantially uniform current distribution in the catholyte region. Screen 210 opposite anode 200 may be placed at any convenient distance from said anode and the positional relationship between screen 210 and anode 200 is not critical. This is true because the function of screen 210 is to remove the primary current from the anolyte region. The redistribution of the primary current in the catholyte region is substantially controlled by the positional relationship between screen 214 and the cathode. The lack of restriction on the location and position of screen 210 with respect to anode 200 advantageously simplifies the construction and operation of the cell of FIG. 2 and permits relatively unrestricted use of solution agitation and electrode movement apparatus.

Figure 3:
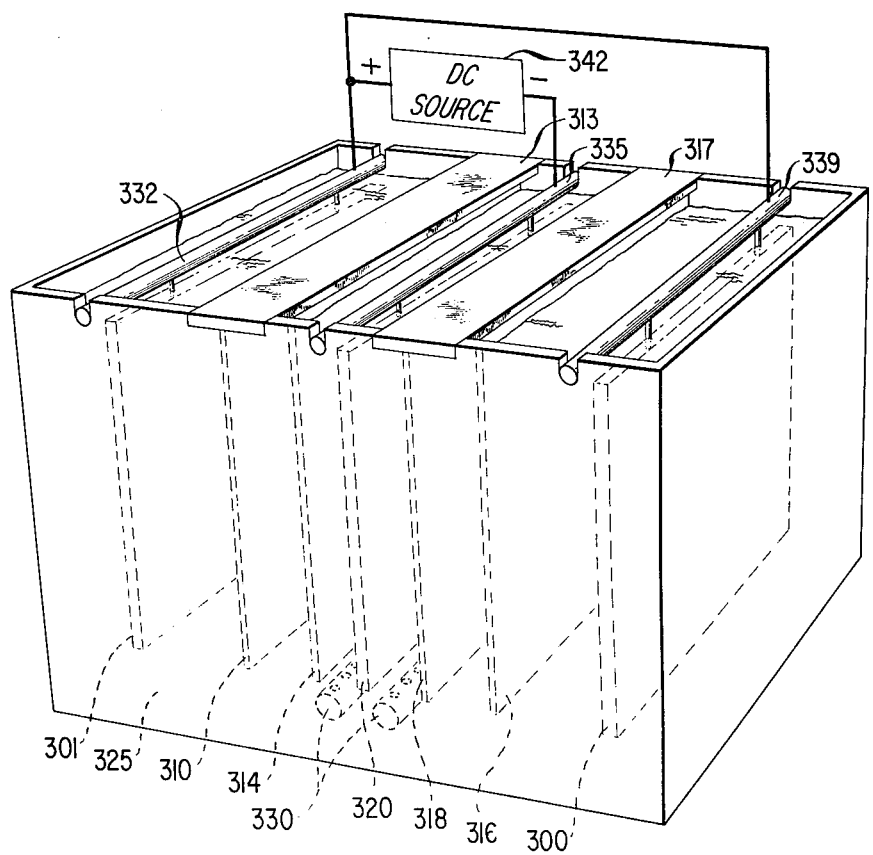
FIG. 3 depicts an electroplating cell for the deposition of copper in the preparation of a printed circuit board according to the invention.

FIG. 3 shows an electroplating cell arrangement adapted to plate copper on the two opposite sides of an epoxy baseboard previously coated with a thin layer of electroless copper. After plating is completed, the board may be processed for use as a printed wiring board. Electrolytic solution 325 in the electroplating cell may, for example, contain 0.27 molar $CuSO_4$, 1.76 molar $H_2SO_4$ for high conductivity, and other additives. The concentration of $Cu^{++}$ ions is approximately 0.27 M., the concentration of $H^+$ ions is approximately 1.49 M., and the concentration of $HSO_4^-$ ions is approximately 2.03 M. Copper anodes 300 and 301 may be of any convenient shape and are connected to the positive terminal of d.c. source 342 via anode holders 339 and 332, and each side of the cathodic workpiece 320 is connected to the negative terminal of source 342 via holder 335.

Two bipolar electrodes are placed in the cell in symmetrical relationship. One bipolar electrode comprising copper screens 310 and 314 is placed intermediate copper anode 301 and the left side of cathodic workpiece 320. The other bipolar electrode comprising copper screens 316 and 318 is placed intermediate anode 300 and the right side of cathodic workpiece 320. Low resistance bus 313 interconnects conducting screens 310 and 314 and low resistance bus 317 interconnects conducting screens 316 and 318. While screens 314 and 318 facing cathodic workpiece 320 are in spaced, parallel relation to the electrochemically active sides of cathode 320 at a predetermined distance therefrom, screen 310 may be placed at any convenient location in the cell intermediate screen 314 and anode 301. Similarly, screen 316 may be placed at any convenient location intermediate screen 318 and anode 300. The orientation of screens 310 and 316 with respect to anodes 301 and 300 is not critical.

Perforated tubes 330 may be inserted into the electroplating cell below cathode workpiece 320. One tube is positioned between cathode 320 and screen 314, while the other tube is positioned between cathode 320 and screen 318. Air or oxygen is formed through tubes 330 to provide a uniform flow of gas bubbles in the electrolytic solution in the vicinity of the active surfaces of the cathodic workpiece. Additionally, the cathodic workpiece may be subjected to oscillatory transverse or side to side motion by apparatus well known in the art (not shown) to further improve uniformity of plating.

In operation, d.c. source 342 applies an overvoltage between anodes 300 and 301 and cathodic workpiece 320. $Cu^{++}$ ions are formed in the anolyte regions, which ions are transported to the cathodic bipolar electrode screens 310 and 316 under the influence of the potential difference between the anodes and the cathodic bipolar electrode screens. The electrochemical reaction at the cathodic screens results in the plating of copper thereon. Current at screens 310 and 316 flows through buses 313 and 317, respectively, to anodic bipolar electrode screens 314 and 316. $Cu^{++}$ ions enter into the electrolytic solution at screens 314 and 316 as a result of the electrochemical reaction between the electrolytic solution and the anodic screens. The $Cu^{++}$ ions are then transported in the electrolytic solution to the active sides of cathodic workpiece 320 in the presence of air or oxygen bubbles, while cathodic workpiece 320 is subjected to oscillatory motion. As in the cells of FIGS. 1 and 2, the bipolar electrodes in the cell of FIG. 3 are operative to remove current from the cell anolyte regions, which current is nonuniformly distributed. Said current is then redistributed in the catholyte region by the bipolar electrode anodic screens. The geometry and spacial relationship of the bipolar electrode anodic screens with respect to the cathode is carefully controlled whereby the current in the catholyte region is distributed uniformly substantially independent of the size, shape, and position of the cell anodes.

When any portion of screens 314 and 318 is deplated of copper, the uniform distribution of current in the catholyte region is disturbed. Just prior to such deplating, the anodic screens may be replaced to maintain the uniformity of current distribution. Since cathodic screens 310 and 316 are plated with copper during the cell operation, the repositioning of the bipolar electrodes results in the needed change of the anodic screens. If, during the plating process, the bipolar electrodes are periodically repositioned so that each screen is alternately plated by the anode and deplates onto the cathode, the operation of the cell may be continuous. In the deposition of printed wiring boards, the use of a 5 mil thick copper surface on the anodic screen assures completion of the copper plating of the board without interruption.

Figure 4:
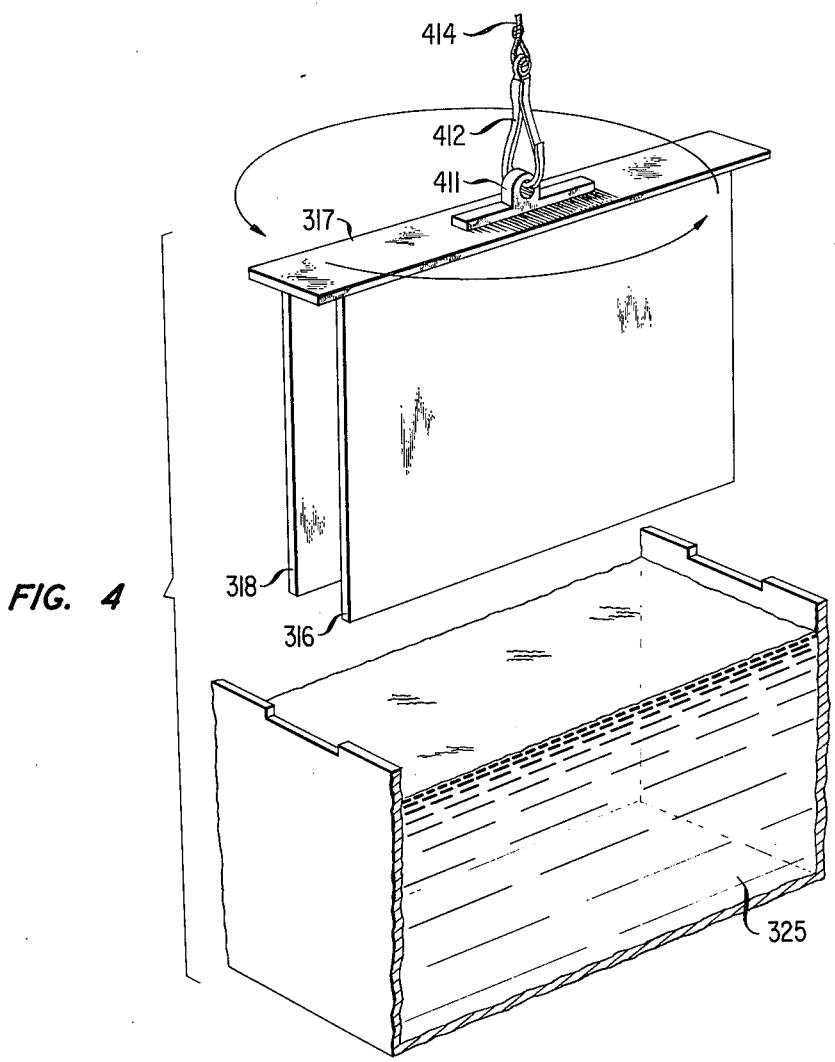
FIG. 4 shows an arrangement for repositioning electrodes useful in the electroplating cells of FIGS. 1, 2 and 3.

FIG. 4 shows a section of the electrodeposition cell of FIG. 3. This section includes screens 316 and 318 and bar 317. Bar 317 in FIG. 4 further includes holder 411 into which hook 412 is inserted. Cable 414 is attached to hook 412 and is, in turn, connected to hoisting apparatus well known in the art (not shown). In order to reposition screens 316 and 318, the bipolar electrode is hoisted out of electrolyte 324 and is manually rotated 180 degrees whereby the positions of screens 316 and 318 are reversed. The bipolar electrode is then lowered into position in the cell so that bar 317 rests in the notched portions of the cell walls. Similar apparatus may be used to rotate screens 310 and 314 of the electrodeposition cell of FIG. 3. The use of hoisting apparatus as shown in FIG. 4 provides for periodic reversal of the bipolar electrode screens.

Figure 5:
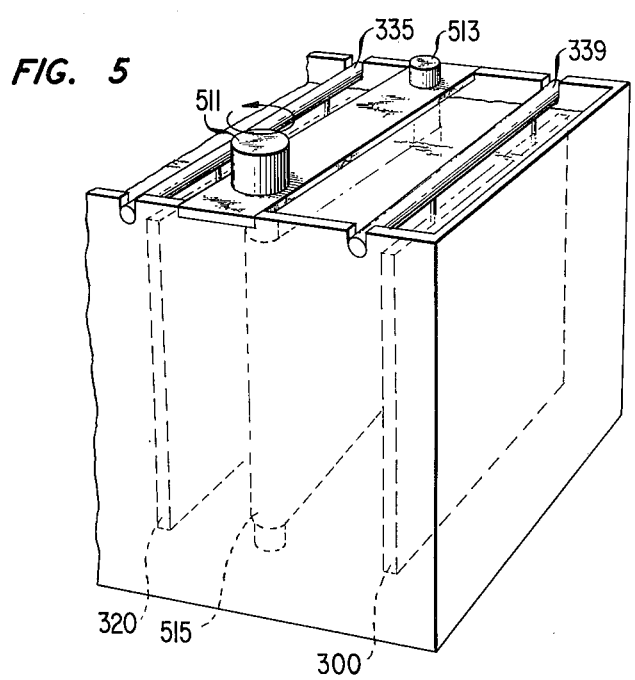
FIG. 5 shows an alternate arrangement of the electrodes of FIG. 3 illustrative of the invention.

FIG. 5 shows an alternate arrangement of the bipolar electrode of FIG. 3 in which electrodes 316 and 318 are joined at their ends to form continuous belt 515. As shown in FIG. 5, one side of belt 515 is placed a predetermined distance away from cathode 320 and forms the anodic section of the bipolar electrode. The other side of belt 515 is opposite anode 300. This side forms the cathodic section of the bipolar electrode. Belt 515 is mounted between rotating posts 511 and 513. Post 511 is connected to a rotation mechanism such as a relatively slow-speed electrical motor to provide continuous or alternatively, periodic rotation of belt 515. In this way, the anodic surface of belt 515 is continuously moved at a rate to prevent depletion of the copper on its surface. The rotation arrangement substitutes for the periodic reversal of the positions of the bipolar screens, as shown in FIG. 4.

The electroplating cells of FIGS. 1, 2, 3 and 5 are usable for electrodeposition of other metals with appropriate changes in electrodes and electrolytic solutions. Silver may be electroplated on a cathode workpiece according to the invention, where silver anodes, silver-surfaced porous electrodes or screens are used and an aqueous solution of approximately AgCN (45 g/l), KCN (75 g/l), and $K_2CO_3$ (15 g/l) serves as the electrolyte. In operation, the current density for silver deposition is in the range between 5 to 15 $mA/cm^2$, with a temperature range of 20° C to 35° C.

Nickel can be electroplated on a cathodic workpiece in accordance with the invention, where nickel anodes and nicke-surfaced porous electrodes or screens are used as in aqueous solution of approximately $NiSO_4.6H_2O$ (225 g/l), $NiCl_2.6H_2O$ (60 g/l), $H_3BO_3$ (37.5 g/l) with pH adjusted with $H_2SO_4$ (2 to 4 g/l). In operation, the current density is approximately 10 $mA/cm^2$ in a temperature range of 40° C to 60° C.

Solder can be electroplated on a cathodic workpiece in accordance with the invention where solder composition anodes, solder composition surfaced porous electrodes of screens are used in an aqueous solution of approximately 52 g/l stannous tin, 30 g/l lead, 40 g/l $HBF_4$, 25 g/l $H_3BO_3$, and 5 g/l peptone. In operation, a current density in the range of 15 to 30 $mA/cm^2$ is used, with a temperature range of 15° C to 40° C.

Gold is electroplatable on a cathodic workpiece in accordance with the invention where gold-surfaced anodes and gold-surfaced porous electrodes of screens are used with an aqueous solution of approximately 16.1 g/l $KAu(CN)_2$ (65 percent weight Au), 54.3 g/l KCN, and 4.68 g/l KOH. In operation, the current density is approximately 1 to 5 mA/cm² and the temperature range is betweem 35° C to 70° C.

Although this invention and its embodiments have been described with reference to certain specific examples and illustrative embodiments, it is not intended that it be so limited except insofar as appears in the following claims.

What is claimed is:

1. Apparatus for electrodepositing a selected metal onto a surface comprising an electrolytic solution, means for containing said electrolytic solution, an anode of the depositing metal in said electrolytic solution, a cathode in spaced relation to said anode in said electrolytic solution, one side of said cathode being the surface on which said selected metal is deposited, a pair of metal screen electrodes intermediaate said anode and said cathode in said electrolytic solution, means for electrically interconnecting said pair of electrodes, means for positioning one of said electrodes in close proximity to said cathode, means for positoning the other of said electrodes between said node and said one of said electrodes, and means for periodically reversing the positions of said pair of electrodes whereby said metal is uniformly deposited on said cathode side from the electrode in close proximity thereto substantially independent of the position, size, and shape of said anode.

2. Apparatus for electrodepositing a selected metal onto a surface according to claim 1 wherein said selected metal is from the group consisting of copper, nickel, gold, silver, and tin-lead.

3. Apparatus for electrodepositing a metal onto a surface according to claim 2 wherein said one electrode in close proximity to said cathode is positioned substantially parallel with said cathode side being deposited.

4. Apparatus for electrodepositing a metal onto a surface according to claim 2 wherein said other electrode is positioned in substantially parallel, spaced relation with said one electrode, said one electrode in close proximity to said cathode being substantially parallel to said cathode.

5. Apparatus for electrodepositing metal onto a surface according to claim 2 wherein each electrode screen has dimensions substantially similar to the dimensions of said cathode side being the surface deposited.

6. Apparatus for electrodepositing a selected metal onto a surface according to claim 1, wherein each of said pair of electrodes comprises a flexible electrode, said electrodes being in spaced, parallel relation and being joined at their ends to form a continuous electrically conductive belt, and said means for periodically reversing said electrodes comprises means for rotating said continuous belt to periodically change the positions of said pair of electrodes.

7. Apparatus for electrodepositing copper comprising an aqueous solution of $CuSO_4$ means for containing an aqueous solution, a copper anode in said solution, a cathode workpiece a pair of metal screen electrodes, each platable with copper in spaced relation intermediate said anode and cathode means for electrically interconnecting said pair of electrodes, means for positioning one of said pair of electrodes in parallel relation to and in close proximity to said cathode workpiece, means for positioning the other electrode intermediate said one electrode and said copper anode, and means for periodically reversing the positions of said one electrode and said other electrode, said electrode in close proximity to said cathode workpiece being initially plated with copper whereby the copper from said electrode in close proximity to said cathode workpiece is uniformly deposited on said cathode workpiece substantially independent of the size, position, and shape of said copper anode.

* * * * *

UNITED STATES PATENT AND TRADEMARK OFFICE
CERTIFICATE OF CORRECTION

PATENT NO. : 4,043,891
DATED : August 23, 1977
INVENTOR(S) : Richard C. Alkire, Werner Engelmaier and
Thomas J. Kessler It is certified that error appears in the above-identified patent and that said Letters Patent are hereby corrected as shown below:

Column 4, line 57, "$HSO_4$-" should read --$HSO_4^-$--.
Column 5, line 19, "formed" should read --forced--.
Column 6, line 49, "nicke" should read --nickel--. Claim 1, line 21, "node" should read --anode--. Claim 7, line 23, insert a comma after "cathode".

Signed and Sealed this

Twenty-fifth Day of July 1978

[SEAL]

Attest:

RUTH C. MASON
Attesting Officer

DONALD W. BANNER
Commissioner of Patents and Trademarks